Figure 1:
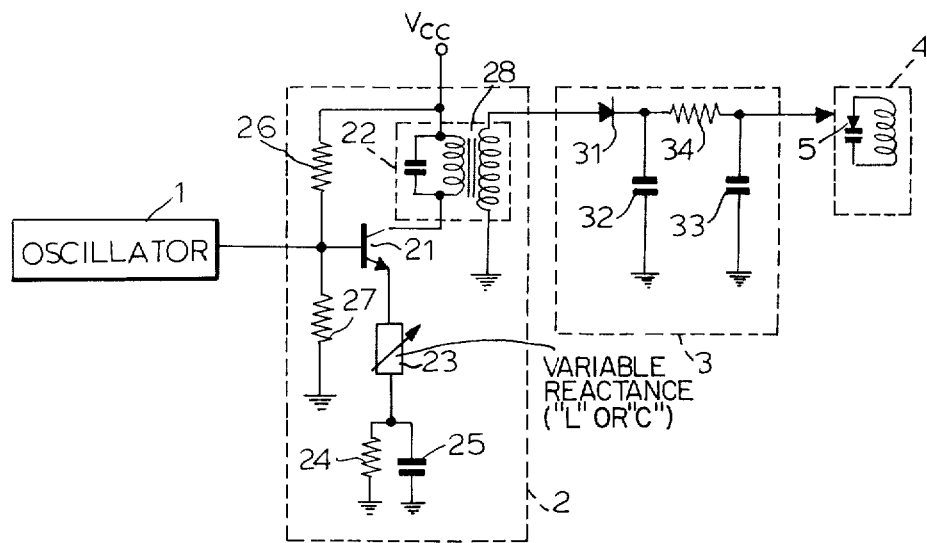

United States Patent [19]

Serizawa et al.

[11] 4,059,791
[45] Nov. 22, 1977

[54] VOLTAGE SUPPLY CIRCUIT FOR VOLTAGE-DEPENDENT CAPACITOR DIODE TUNING

[75] Inventors: Masabumi Serizawa, Ikoma; Tsuneo Takezaki, Noyagawa, both of Japan

[73] Assignee: Matsushita Electric Industrial Co., Ltd., Kadoma, Japan

[21] Appl. No.: 682,176

[22] Filed: Apr. 30, 1976

[30] Foreign Application Priority Data

May 6, 1975   Japan .................................. 50-54847

[51] Int. Cl.² .......................................... H02M 3/335
[52] U.S. Cl. ..................................... 363/37; 307/240; 363/140
[58] Field of Search ............ 321/2, 43, 44, 48, 69 NL; 331/42, 74, 75, 76, 112; 323/17, DIG. 1; 307/240

[56] References Cited

U.S. PATENT DOCUMENTS

| | | | |
|---|---|---|---|
| 3,307,117 | 2/1967 | Williams | 331/76 |
| 3,398,376 | 8/1968 | Olson | 331/76 |
| 3,560,833 | 2/1971 | Oishi et al. | 321/2 |
| 3,665,342 | 5/1972 | Reed | 331/75 |
| 3,803,517 | 4/1974 | Bellocchio | 321/2 |
| 3,958,168 | 5/1976 | Grundberg | 321/2 |

*Primary Examiner*—Gerald Goldberg
*Attorney, Agent, or Firm*—Wenderoth, Lind & Ponack

[57] ABSTRACT

In a voltage supply circuit for voltage-dependent capacitor diode tuning, a d.c. voltage is produced by a.c.-d.c. conversion of an a.c. voltage which is obtained by amplifying an a.c. signal from an oscillator with the aid of a transistor amplifier of the series-feedback type having an amplifying transistor having an amplification factor depending on a variable reactance coupled to an emitter of the amplifying transistor. The variable reactance controls the amount of negative feedback to obtain the corresponding gain of the amplifier. The degree of amplification decreases as the amount of the negative feedback increases, so that the output d.c. voltage will be stable especially in a low voltage region.

10 Claims, 2 Drawing Figures

VOLTAGE SUPPLY CIRCUIT FOR VOLTAGE-DEPENDENT CAPACITOR DIODE TUNING

This invention relates to a voltage supply circuit for voltage-dependent capacitor diode tuning, and to a tuning apparatus formed of the voltage supply circuit and a voltage-dependent capacitor diode.

It is well known that a voltage-dependent capacitor diode can be used for tuning. It tunes a frequency depending on the d.c. voltage applied thereto. A typical conventional technique for obtaining a desired d.c. voltage is to increase the voltage of a d.c. power supply to a maximum voltage, stabilize the increased voltage, and divide the stabilized voltage by a voltage divider such as a potentiometer. However, this technique is disadvantageous in that for presetting the voltage supply circuit to predetermined frequencies, a number of potentiometers equal to the number of predetermined frequencies are required, or alternatively a complicated mechanical arrangement is required if required voltages are designed to be obtained by using only one potentiometer and by dividing the voltage of the single potentiometer by various ways by means of a tuning frequency adjustment knob. Further, in such a technique which uses at least one potentiometer for regulating voltages for tuning frequency control, at least one mechanical sliding contact sliding or the potentiometer is inherently required. This mechanical contact is likely to cause electrical noises and fluctuation of the tuning control voltage due to the fluctuation of electrical contact resistance.

It is an object of this invention to provide a d.c. voltage supply circuit for voltage-dependent capacitor diode tuning, which can supply a desired and stable d.c. voltage by means of a simple circuit arrangement.

It is another object of this invention to provide a tuning apparatus including a voltage-dependent capacitor diode to which any desired and stable d.c. voltage can be applied by means of a simple circuit arrangement, so that any desired frequency can be tuned accurately and easily.

These objects are achieved according to this invention by a voltage supply circuit for applying a tuning frequency control voltage, comprising: an oscillator for producing an a.c. signal at an output terminal thereof; a voltage regulator having an input terminal thereof coupled to the output terminal of the oscillator for producing an a.c. voltage at an output terminal thereof, the voltage regulator comprising a transistor amplifier of series feedback type comprising an amplifying transistor the base of which is coupled to the oscillator and the emitter of which is coupled to a variable reactance element provided for controlling the amount of negative feedback and controlling the degree of amplification of the transistor amplifier, and a tank circuit including an inductance element and having a resonant frequency the same as the frequency of the a.c. signal from the oscillator, the tank circuit being coupled to the collector of the amplifying transistor and also coupled to the output terminal of the voltage regulator; and a voltage converter having an input terminal thereof coupled to the output terminal of the voltage regulator for converting the a.c. voltage from the voltage regulator to a d.c. voltage. This invention also includes a tuning apparatus comprising such a voltage supply circuit and a tuning circuit including a voltage-dependent capacitor diode to which the d.c. voltage from the voltage converter, i.e. from the voltage supply circuit, is applied for tuning. According to the arrangement of this invention, the amount of the negative feedback due to the reactance element increases as the degree of amplification of the amplifying transistor decreases, so that the output d.c. voltage will be stable especially in a low voltage region.

Figure 2:
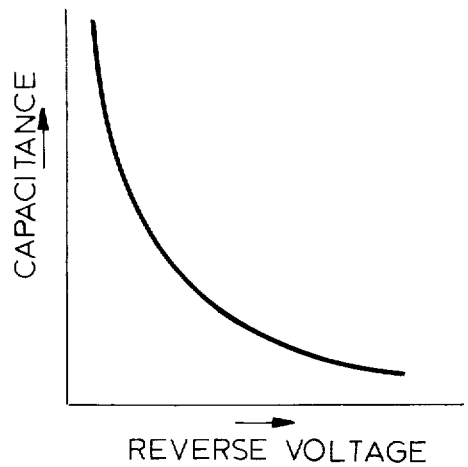

These and other objects and features of this invention will be apparent from the following description taken together with the accompanying drawings, in which:

FIG. 1 is a schematic circuit diagram, partially in block form, of an example of a voltage supply circuit according to this invention; and FIG. 2 is a graph showing dependence of the capacitances of a voltage-dependent capacitor diode on applied voltages.

According to this invention, a stable oscillator output (a.c. signal) is applied to a transistor amplifier comprising an amplifying transistor, the amount of negative feedback being controlled by a variable reactance element coupled to the emitter of the amplifying transistor, and the amplifier output (a.c. voltage) is rectified to a d.c. voltage which is the desired output d.c. voltage and which is then to be applied to a voltage-dependent capacitor diode in a tuning circuit.

Referring to FIG. 1, reference numeral 1 designates an oscillator, the frequency and the voltage of the output a.c. signal of which are sufficiently stable. The frequency of the output a.c. signal of the oscillator 1 is selected to be any frequency which does not interfere with receiver performance. Known oscillators can be used for the oscillator 1. Reference numeral 2 designates a voltage regulator which converts the voltage of the a.c. signal from the oscillator 1 to a desired a.c. voltage. Reference numeral 3 designates a voltage converter (rectifier circuit) which converts the a.c. voltage from the voltage regulator 2 to a d.c. voltage. The d.c. output voltage from the voltage converter 3 is applied to a voltage-dependent capacitor diode 5 which is a tuning element in a tuning circuit 4.

Reference numeral 21 designates an amplifying transistor which amplifies the output voltage of the oscillator 1. Reference numeral 22 designates a tank circuit having a resonant frequency the same as the frequency of the a.c. signal from the oscillator and being coupled at one terminal thereof to the collector of the amplifying transistor 21. The tank circuit 22 comprises a resonant circuit including a capacitor and an inductance element, and a transformer 28. The transformer in FIG. 1 comprises the inductance element of the resonant circuit as its primary winding, and its secondary winding is coupled to the output of the voltage converter 3. However, instead of connecting the capacitor to the primary winding of the transformer 28 as is shown in FIG. 1, the capacitor for the resonant circuit can be connected in parallel to the secondary winding of the transformer 28 (this connection not being shown in FIG. 1) so as to make the secondary winding a component of the resonant circuit. The transformer 28 increases by means of a suitable turn ratio the voltage induced in the primary winding. To the terminal 35, a voltage $V_{cc}$ of a suitable power supply is applied. Reference numeral 23 designates a variable reactance element, one end of which is coupled to the emitter of the amplifying transistor 21, and the other end of which is coupled to a parallel connection of a resistor 24 and a bypass capacitor 25 as shown. The variable reactance element 23 can be a variable inductance element or a variable capacitance element. Reference numerals 26 and 27 are base bias resistors coupled to the base of the amplifying transistor 21 as shown. The other end of the resistor 26 is coupled to the other terminal of the tank circuit 22. Since the input signal to the amplifying transistor 21 is a voltage difference between the base of the transistor 21 and one end of an impedance element (reactance element 23) which is coupled at the other end thereof to the emitter of the transistor 21, and the output signal of the transistor 21 is a voltage difference between the collector of the transistor 21 and said one end of said impedance element, the transistor amplifier shown in FIG. 1 comprising the amplifying transistor 21 can be called an amplifier of the series feedback type. Reference numeral 31 designates a diode for rectification which is coupled to a smoothing circuit constituted by a resistor 34 and capacitors 32 and 33 as shown.

Assuming that the load impedance of the collector of the amplifying transistor is $Zl$ and the impedance between the emitter of the amplifying transistor 21 and the ground is $Ze$, and that the voltage regulator is stable in its d.c. operation with respect to fluctuation due to temperature and voltage $V_{cc}$ of power supply, the degree of a.c. amplification with a constant a.c. voltage applied to the base of the amplifying transistor 21 is proportional to $Zl/Ze$. Since the impedance $Ze$ is attributed mostly to the variable reactance element 23, the output voltage appearing across the primary winding of the transformer 28 which is the load depends on the reactance of the reactance element 23. The output a.c. voltage appearing across the primary winding of the transformer 28 is increased to a suitable predetermined voltage by transformer 28, and is then converted to a desired d.c. voltage by being rectified and smoothed by the voltage converter 3.

Since the circuit arrangement described above produces a single oscillation frequency and a constant output voltage, the oscillation of the oscillator 1 can be easily stabilized with a simple circuit arrangement, and a sufficiently stable d.c. output voltage can be obtained by sufficiently stabilizing this oscillation of the oscillator 1. Further, considering the operation of the voltage regulator 2, the impedance $Ze$ between the emitter of the amplifying transistor 21 and ground provides a negative feedback. When the impedance $Ze$ increases, the amount of negative feedback also increases, so that the amplifying operation of the transistor 21 becomes more stabilized. In this case, the degree of amplification of the transistor amplifier decreases as described above, and the output a.c. voltage of the voltage regulator 2 decreases. That is, when the desired output d.c. voltage of the voltage converter 3 is low, the output d.c. voltage is more stable due to the function of negative feedback than in the case when the output d.c. voltage is high. Namely, in a low d.c. output voltage region, the fluctuation of the d.c. output voltage is small.

This characteristic of the output d.c. voltage is advantageous especially when the output d.c. voltage is to be applied to the usual voltage-dependent capacitor diode in a tuning circuit, is the purpose of as this invention. This is because the usual voltage-dependent capacitor diode usually used for tuning has capacitances, as shown in FIG. 2, which have a larger voltage dependence in a lower reverse applied voltage region than in a higher reverse applied voltage region. That is, the applied voltage is required to be more stable in a lower applied voltage region than in a higher applied voltage region. The output d.c. voltage from the voltage converter 3 meets this requirement.

Although any variable impedance element can be used for the variable reactance element 23, a conventional variable resistor is not suitable therefor, because the conventional variable resistor requires a sliding contact which causes disadvantages as described above.

A conventional tuner, the variable element of which is an inductance element such as in a radio receiver in an automobile, usually has a preset mechanism for presetting the inductance element, so that preset tuning can be achieved thereby. A tuner for such an automobile radio receiver usually has two variable inductance elements in an RF amplifier and one variable inductance element in a local oscillator, and these three variable inductance elements are designed to be varied simultaneously by being linked to each other. Further, in a tuner for an automobile radio receiver designed to receive both AM and FM bands, six inductance elements are used. In the circuit arrangement of this invention is employed, such three inductance elements in the former case or such six inductance elements in the latter case can be replaced by one inductance element, and thus ganging adjustment of such plural inductance elements becomes unnecessary. Therefore, this invention reduces the cost of tuners.

Further, when the tuning controlling voltage in the conventional tuner is required to be higher than the voltage of the power supply, an additional technique to increase the d.c. voltage e.g. by means of a d.c.-d.c. converter is necessary. The increased d.c. voltage is stabilized and is then applied to a tuning circuit. However, this invention does not need such a technique, and easily and conveniently produces a desired d.c. voltage, so that this invention can advantageously be applied not only to a radio receiver but also to a television receiver, if it includes voltage-dependent capacitor diode tuning.

What is claimed is:

1. A voltage supply circuit for voltage-dependent capacitor diode tuning, comprising: an oscillator for producing an a.c. signal at an output terminal thereof; a voltage regulator having an input terminal thereof coupled to said output terminal of said oscillator for producing an a.c. voltage at an output terminal thereof, said voltage regulator having a transistor amplifier of the series-feedback type having an amplifying transistor the base of which is coupled to said oscillator and a variable reactance element coupled to the emitter of said transistor for controlling the amount of negative feedback and controlling the degree of amplification of said transistor amplifier, and a tank circuit having a resonant frequency the same as the frequency of said a.c. signal from said oscillator, said tank circuit being coupled to the collector of said amplifying transistor and also coupled to said output terminal of said voltage regulator; and a voltage converter having the input terminal thereof coupled to said output terminal of said voltage regulator for converting said a.c. voltage from said voltage regulator to a d.c. voltage.

2. A voltage supply circuit according to claim 1, wherein said variable reactance element is a variable inductance element.

3. A voltage supply circuit according to claim 1, wherein said variable reactance element is a variable capacitor.

4. A voltage supply circuit according to claim 1, wherein said tank circuit comprises a capacitor and two inductance elements forming a transformer the primary winding of which is connected in a resonant circuit together with said capacitor, and the secondary winding of which is the other of said inductance elements and is connected to said voltage converter.

5. A voltage supply circuit according to claim 1, wherein said voltage converter comprises a rectifier coupled to said output terminal of said voltage regulator and a smoothing circuit coupled between said rectifier and said output terminal of said voltage converter.

6. A tuning apparatus for voltage-dependent capacitor diode tuning, comprising: a voltage supply circuit having: (1) an oscillator for producing an a.c. signal at an output terminal thereof; (2) a voltage regulator having an input terminal thereof coupled to said output terminal of said oscillator for producing an a.c. voltage at an output terminal thereof, said voltage regulator having a transistor amplifier of the series-feedback type having an amplifying transistor the base of which is coupled to said oscillator and a variable reactance element coupled to the emitter of said transistor for controlling the amount of negative feedback and controlling the degree of amplification of said transistor amplifier, and a tank circuit having a resonant frequency the same as the frequency of said a.c. signal from said oscillator, said tank circuit being coupled to the collector of said amplifying transistor and also coupled to said output terminal of said voltage regulator; and 3) a voltage converter having the input terminal thereof coupled to said output terminal of said voltage regulator for converting said a.c. voltage from said voltage regulator to a d.c. voltage; and a tuning circuit including a voltage-dependent capacitor diode to which said d.c. voltage from said voltage converter is applied for tuning.

7. A tuning apparatus according to claim 6, wherein said variable reactance element is a variable inductance element.

8. A tuning apparatus according to claim 6, wherein said variable reactance element is a variable capacitor.

9. A tuning apparatus according to claim 6, wherein said tank circuit comprises a capacitor and two inductance elements forming a transformer the primary winding of which is connected in a resonant circuit together with said capacitor, and the secondary winding of which is the other of said inductance elements and is connected to said voltage converter.

10. A tuning apparatus according to claim 6, wherein said voltage converter comprises a rectifier coupled to said output terminal of said voltage regulator and a smoothing circuit coupled between said rectifier and said output terminal of said voltage converter.

* * * * *